(12) United States Patent
Sweegers et al.

(10) Patent No.: US 10,164,161 B2
(45) Date of Patent: Dec. 25, 2018

(54) DIRECTIONAL LIGHT EMITTING ARRANGEMENT AND A METHOD OF PRODUCING THE SAME

(71) Applicant: KONINKLIJKE PHILIPS N.V., Eindhoven (NL)

(72) Inventors: Norbertus Antonius Maria Sweegers, Eindhoven (NL); Floris Maria Hermansz Crompvoets, Aachen (DE); Marc Andre De Samber, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/520,782

(22) PCT Filed: Oct. 20, 2015

(86) PCT No.: PCT/EP2015/074250
§ 371 (c)(1),
(2) Date: Apr. 20, 2017

(87) PCT Pub. No.: WO2016/066476
PCT Pub. Date: May 6, 2016

(65) Prior Publication Data
US 2017/0317251 A1    Nov. 2, 2017

(30) Foreign Application Priority Data

Oct. 27, 2014  (EP) .................................. 14190417

(51) Int. Cl.
*H01L 33/60* (2010.01)
*H01L 33/50* (2010.01)
(Continued)

(52) U.S. Cl.
CPC ............ *H01L 33/60* (2013.01); *H01L 27/156* (2013.01); *H01L 33/46* (2013.01); *H01L 33/502* (2013.01);
(Continued)

(58) Field of Classification Search
CPC ..... H01L 33/60; H01L 33/507; H01L 33/502; H01L 27/156; H01L 2933/0041; H01L 2933/0058
See application file for complete search history.

(56) References Cited

U.S. PATENT DOCUMENTS 9,269,873 B2   2/2016  Imazu et al.
2004/0119668 A1*  6/2004  Homma ................. H01L 33/54
345/82
(Continued)

FOREIGN PATENT DOCUMENTS

EP       2423984 A2   2/2012
EP       2693854 A2   2/2014
(Continued)

OTHER PUBLICATIONS

EPO as ISA, "International Search Report and Written Opinion" dated Feb. 26, 2016 from International Application No. PCT/EP2015/074250, filed Oct. 20, 2015, 16 pages.
(Continued)

*Primary Examiner* — Steven Loke
*Assistant Examiner* — Juanita Rhodes

(57) ABSTRACT

A light emitting arrangement is suggested for generating directional projections of light with sharply defined beam profile. Light from a top-emitting solid state light source (12), having reflective side-coating (34), is pre-collimated via a beam-shaping optic (16), before being propagated through a secondary collimating funnel (18), capturing any light rays with still too great an escape angle. Chip-scale
(Continued)

package dimensions may be achieved through the use of a thin-film side-coating and undersized phosphor layers. Substrate level process flow further allows for parallel processing of a plurality of devices.

24 Claims, 5 Drawing Sheets

(51) Int. Cl.
    *H01L 27/15*     (2006.01)
    *H01L 33/46*     (2010.01)
    *H01L 33/58*     (2010.01)
    *H01L 33/48*     (2010.01)

(52) U.S. Cl.
    CPC ............ *H01L 33/507* (2013.01); *H01L 33/58* (2013.01); *H01L 33/486* (2013.01); *H01L 2933/0033* (2013.01); *H01L 2933/0041* (2013.01); *H01L 2933/0058* (2013.01)

(56) References Cited

U.S. PATENT DOCUMENTS

| | | | |
|---|---|---|---|
| 2005/0013562 A1* | 1/2005 | Tatehata | G02B 6/4201 385/93 |
| 2007/0181891 A1* | 8/2007 | Eisert | H01L 33/20 257/82 |
| 2010/0090239 A1* | 4/2010 | Lin | H01L 33/486 257/98 |
| 2011/0019432 A1* | 1/2011 | Epmeier | F21S 41/336 362/516 |
| 2011/0042698 A1* | 2/2011 | Chan | C09K 11/7731 257/91 |
| 2012/0112226 A1 | 5/2012 | Grolier et al. | |
| 2013/0207141 A1* | 8/2013 | Reiherzer | H01L 33/505 257/98 |
| 2013/0221380 A1* | 8/2013 | Ankireddi | H01L 25/0753 257/88 |
| 2013/0330855 A1 | 12/2013 | Sekiya | |
| 2014/0256071 A1* | 9/2014 | Park | H01L 33/46 438/27 |

FOREIGN PATENT DOCUMENTS

| | | | | |
|---|---|---|---|---|
| WO | WO 2007054859 A2 * | 5/2007 | ............ | H01L 33/60 |
| WO | 2011108664 A1 | 9/2011 | | |
| WO | 2013137356 A1 | 9/2013 | | |

OTHER PUBLICATIONS

Extended European Search Report dated Apr. 20, 2015, European Application No. 14190417.7, 9 pages.
First Office Action dated Sep. 3, 2018, China Patent Application No. 201580058617, 12 pages.

* cited by examiner

DIRECTIONAL LIGHT EMITTING ARRANGEMENT AND A METHOD OF PRODUCING THE SAME

CROSS-REFERENCE TO RELATED APPLICATIONS

The present application is a § 371 application of International Application No. PCT/EP2015/074250 filed on Oct. 20, 2015 and entitled "DIRECTIONAL LIGHT EMITTING ARRANGEMENT AND A METHOD OF PRODUCING THE SAME", which claims the benefit of European Patent Application No. 14190417.7 filed on Oct. 27, 2014. International Application No. PCT/EP2015/074250 and European Patent Application No. 14190417.7 are incorporated herein.

FIELD OF THE INVENTION

This invention relates to a light-emitting arrangement adapted to produce a directional beam of light.

BACKGROUND OF THE INVENTION

Solid state light sources, such as light emitting diodes (LEDs) are increasingly used for a variety of lighting and signalling applications. Advantages of LEDs over traditional light sources, such as incandescent or fluorescent lamps, include long lifetime, high lumen efficiency, low operating voltage and fast modulation of lumen output. For general lighting applications, commonly LEDs are used which emit a Lambertian light-distribution.

However, for many applications, such as automotive front lighting, directional light sources are preferable. Typically, such directionality is achieved through the use of 'top-emitting' LEDs; LEDs adapted so as to allow light to escape only in a single direction.

In addition to directionality, highly projective, beam-like, emission is often also desired, requiring an arrangement which can realise high-contrast. For example, 'low-beam' automobile front lighting, which projects light only below a certain critical angle, so as to avoid glare for oncoming traffic, requires a sharp horizontal cut-off in emission. A similar requirement is needed for future matrix headlights, with low and high beam functionality. In addition, sharp contrast laterally is also desirable, wherein each LED is able to realise a concrete cut-off not only in height but also in width of the beam, projecting therefore only across a particular segment of the horizon.

High-contrast emission is typically achieved by further collimation of the light emitted from one or more top-emitting LEDs using higher-level optics. In particular, frequently there is used a primary optical element (typically a collimator or reflector) and a secondary optic (typically a lens).

However, in such an arrangement, typically the requirements for the collimation angle and the desired cut off necessitate optical elements having lateral dimensions which significantly exceed those of the LED die beneath, thereby extending the overall footprint incurred by the package. For example, to achieve a collimation angle above and below the normal of 40 degrees, using an input LED die of size 1.0 mm×1.0 mm, a typical collimator, having total internal reflection lens and an air gap between the lens and the light source, would have dimensions of approximately 2.7×1.6×1.6 mm³. For a configuration without an air gap, the dimensions would be approximately 3.5×2.3×2.3 mm³.

Similarly, for an open collimator, based upon a reflector rather than upon total internal reflection, the typical dimensions might be 1.5×1.6×1.6 mm³. Thus, it can be seen that the footprint is significantly increased compared to the LED die size.

An arrangement would be desirable therefore which can achieve highly directional light emission, with sharp longitudinal and latitudinal cut-off, but wherein optical elements do not incur a significant expansion to the footprint of the LED package. This would enable greater LED module density within applications, simplified assembly of arrays of modules, as well as increased general flexibility of the packages.

SUMMARY OF THE INVENTION

The invention is defined by the claims.

According to an aspect of the invention, there is provided a light emitting arrangement, adapted to produce a directional beam of light, comprising:

a solid state light source having a light emitting top surface and one or more lateral side surfaces;

a reflecting structure which covers said side surface or surfaces;

a microstructured beam-shaping arrangement positioned optically downstream from the light source; and an opaque optical body positioned over the reflecting structure, for limiting the angular spread of the directional beam of light, said body having a first opening at its base for receiving light from the solid state light source, and a tapered funnel structure surrounding the axis normal to the light emitting top surface of the light source which opens to a second opening at its top which is larger than the first opening.

The invention comprises an arrangement of a light source together with optical elements and structures which in combination generate a collimated projection of light with a sharp angular cut off. It combines a first beam-shaping optical element, which 'pre-collimates' the light emitted from the light source, with a second optical body which captures any light rays with still too great an escape angle. The light source itself is surrounded at its side surfaces by a reflective structure, ensuring that light only escapes through top-facing surfaces, and additionally acting to improve the brightness of the light source through blocking potential light leaks through side facing surfaces. Any side-directed light is reflected back toward the light source or upward through top-facing surfaces. Preferably, the beam shaping arrangement is sufficiently strongly collimating so that the majority of light rays exiting it are already compliant with the angular cut-off of the secondary optical body. Any light falling outside of the acceptance angle of the beam shaping optic however, and which is consequently not collimated to the desired angle, is captured by this secondary opaque optical body.

This configuration allows for highly directed emission and high-contrast at cut-off angles, but with significantly reduced dimensions. The collimating optic, in combination with the reflectively covered side surfaces of the light source, ensures a high degree of directionality, while the secondary optical body ensures high luminance contrast by capturing aberrantly directed rays.

The solid state light source may comprise an LED of any sort, or, more particularly, may comprise a patterned sapphire substrate, and preferably be a chip scale package LED.

By microstructured is meant that there is an array (one or two dimensional) of beam shaping components within the overall area of the beam shaping device, rather than a single lens or prism. This means the height can be reduced both of the structure itself and the space between the beam shaping device and the light source.

The reflecting structure may comprise a reflecting thin-film coating and a supporting base layer. In this arrangement, a thin film coating covers the side-facing surfaces of the light source, providing a reflective covering which inhibits the escape of light, and additionally, an adjacent supporting base layer which provides structure for the arrangement, and also support for the secondary opaque optical body above it.

A thin film configuration allows for a significantly reduced footprint of the overall arrangement, wherein the supporting base layer is no larger in area than the light emitting top surface of the solid state light source. This is achieved by having the thin film only surround the side surfaces of the light source, while the supporting base layer rests around the edges of the top surface of the light source. In this way, the light source is rendered top-emitting, the secondary optical body is structurally supported, but the dimensions of the overall arrangement do not extend beyond that of the solid state light source itself.

The light emitting arrangement may further comprise a phosphor layer positioned optically downstream from the light source and optically upstream from the beam shaping arrangement, having an area less than the area of the light emitting top surface of the solid state light source. Undersized phosphor layers of this sort further reduce the dimensions of the overall device footprint and additionally improve brightness by reducing the apparent emission size of the light source. The phosphor may comprise a Lumiramic (Trade Mark) type phosphor. Use of an undersized phosphor in combination with the thin film arrangement (and the reduced size of supporting base layer), allows for the realisation of low height directional light in true chip-scale dimensions.

The light emitting arrangement may comprise an air-gap optically downstream from the light source and optically upstream from the beam-shaping arrangement. An air gap between the beam shaping optic and the light source generates reduced collimation angle and narrower beam width (for a given propagation distance). An air-gap therefore may allow for a narrower collimation angle without increasing the dimensions of the secondary collimating optical body.

The optically opaque body may either comprise a black body with a non-reflective surface, or a body with a reflective surface. Using a non-reflective (i.e. completely absorbing) body carries the advantage that virtually no secondary reflected rays are generated, and as a result the overall height of the package may be significantly reduced. This is in contrast to, for example, total internal reflection based collimators, wherein secondary rays are generated and must subsequently reflect several times from the surfaces of the collimator in order to acquire a propagation angle that is within the desired limits.

A black, non-reflective surface surrounding each light source also acts to enhance the contrast of the emitted beam. Any light which does get back-reflected toward the light source, either by the funnel surface(s), the optical beam shaper, or any other surfaces optically downstream, is absorbed and captured, rather than being reflected back by the usual reflective surroundings of the solid state light source. In this way, the luminance of the light source package is more concentrated on the light source itself and any stray light from its surroundings is negligible. Indeed, ideally the light source is the sole source of luminance in the arrangement; emitted light rays emanate from this one location only.

The beam shaping arrangement may comprise a Fresnel plate.

In one embodiment, a plurality of the light emitting arrangements is combined to form a broader lighting unit. In LED automotive lighting, for example, more than one LED package is utilised within each headlight unit, in order to generate the required overall luminosity. Different shaped configurations of light emitting arrangements may be used to generate different resultant beam profiles.

According to another aspect of the invention, there is provided a method of producing a plurality of light emitting elements, comprising providing a plurality of solid state light source units, each solid state light source unit having a light emitting top surface and one or more lateral side surfaces;

providing a product carrier board;

distributing the solid state light source units on the product carrier board;

filling the gaps between said distributed solid state light source units with a reflective material, so as to provide a reflective base structure which covers the lateral side surface or surfaces of the light source units;

applying a microstructured beam-shaping arrangement over the reflective base structure;

providing an opaque optical body, having a plurality of funnel structures each having a first opening at its base;

positioning said opaque optical body on top of the reflective base structure, such that the first opening is over a corresponding solid state light source unit and each funnel structure surrounds the axis normal to the light emitting top surface of the corresponding light source units, and separating the arrangement into singular light emitting elements.

This method has a process flow at the substrate level, enabling parallel processing of the plurality of light emitting elements through the use, for example, of lamination and moulding technologies.

The solid state light source unit may comprise a solid state light source such as a patterned sapphire substrate LED.

The method may further comprise providing a reflecting thin-film coating which covers the one or more lateral side surfaces of the light source units. This might, for example, be provided in advance of filling in the gaps between the distributed light source units with the reflective material. By covering side-facing surfaces with the thin film, the reflective base structure need not extend beyond the light emitting top surface of the solid state light source, since the side-facing surfaces of the light source are already covered by the thin film. In this way, the reflective base structure of each singular light emitting element may be no larger in area than the light emitting top-surface of the solid state light source.

The method may further comprise applying the beam-shaping arrangement such that there is an air gap to the corresponding solid state light source unit.

BRIEF DESCRIPTION OF THE DRAWINGS

Examples of the invention will now be described in detail with reference to the accompanying drawings, in which.

DETAILED DESCRIPTION OF THE EMBODIMENTS

The invention provides a light emitting arrangement for generating directional projections of light with sharply defined beam profile. Light from a top-emitting solid state light source, having reflective side-coating, is pre-collimated via a beam-shaping optic, before being propagated through a secondary collimating funnel, capturing any light rays with still too great an escape angle. Chip-scale package dimensions may be achieved through the use of a thin-film side-coating and undersized phosphor layers. Substrate level process flow further allows for parallel processing of a plurality of devices.

The arrangement is designed to achieve directional light emission, with high-contrast, but at chip-scale dimensions. By chip-scale dimensions is meant dimensions of the light-emitting arrangement, taken as a package, which fall within those standardly understood to render the arrangement a chip scale package. By high contrast emission is meant a high contrast at the beam edge; the degree to which the generated beam has sharply defined boundaries.

The beam-shaping arrangement utilised within some examples of the invention performs a beam-shaping function. This function may for example approximate at least a partial collimation function, in the sense that light exits with a controlled range of exit angles, to illuminate a desired field of view. In the examples below, the optical function will be referred to as "collimation" for ease of explanation, but it will be understood that this should not be considered limiting. The invention, in various embodiments, may generate a range of different beam shapes with, for example, a range of different widths. An embodiment which generates a very wide beam profile, for example, may include a beam shaping arrangement whose function falls very far from that of true collimation, in the sense of limiting emission just to rays with exit angle directly parallel with the surface normal.

Figure 1:
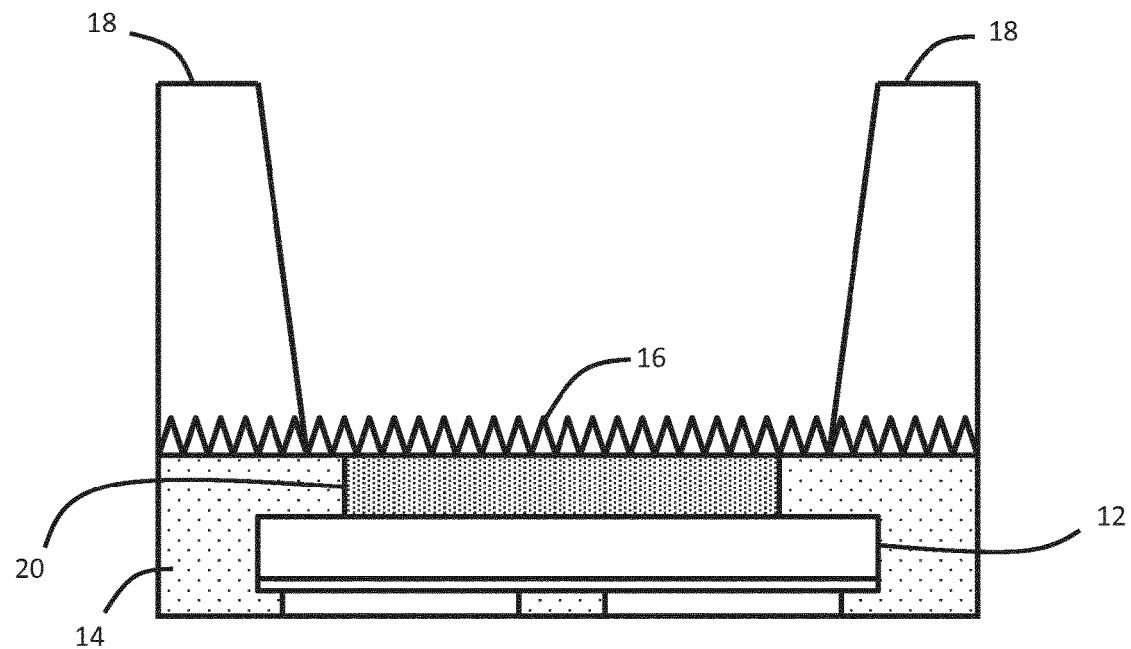
FIG. 1 shows a first example of a light emitting arrangement in accordance with the invention.

In FIG. 1 is shown a first example of a light emitting arrangement in accordance with the invention. A solid state light source 12 has side-facing surfaces surrounded by a reflecting structure 14, which covers said surfaces such that light is able to escape only through its top-facing surface(s). Optionally, a luminescent phosphor layer 20 may also be provided, into which light emitted through the top-facing surface(s) of the light source 12 is propagated. In this case, the reflecting structure further covers the side facing surfaces of the phosphor layer, ensuring, in addition to the light source 12, that light is only emitted through its top-facing surface.

Across the top surface(s) of the light source 12 (or the phosphor layer 20 where one is provided) is positioned a beam shaping arrangement 16; an optical body which performs a beam-shaping function upon light emitted through the top surface of the light source (or of the phosphor layer). In particular, the beam shaping arrangement may act so as to collimate or partly collimate the light which passes through it.

A secondary (opaque) optical body 18, having a funnel-like structure, is positioned over the top of the reflecting structure, its main surface surrounding the axis normal to the light emitting top surface of the light source 12. The funnel structure performs a secondary collimating function: light exiting through the top surface of the beam shaping arrangement 16 enters the funnel structure through a proximal opening and propagates along the longitudinal axis of the structure toward a distal opening at its tip. Light rays exiting the beam shaping arrangement with too wide a propagation angle fall incident upon the surface(s) of the collimating funnel and are either absorbed by the surface(s) or reflected back toward the proximal end of the funnel. In this way, only rays with propagation angles falling inside those defined by the boundaries of the funnel are allowed to escape through the distal end. In a preferred example, the angle defined by the boundary of the funnel, with respect to the base of the central longitudinal axis of the funnel, is less than or equal to 40 degrees. The funnel may be circular in which case this 40 degree or less angle applies all around the structure. However, it may not be circular. The maximum angle between the base of the central longitudinal axis of the funnel and any point at the top edge of the funnel may then be 40 degrees or less.

Figure 2:
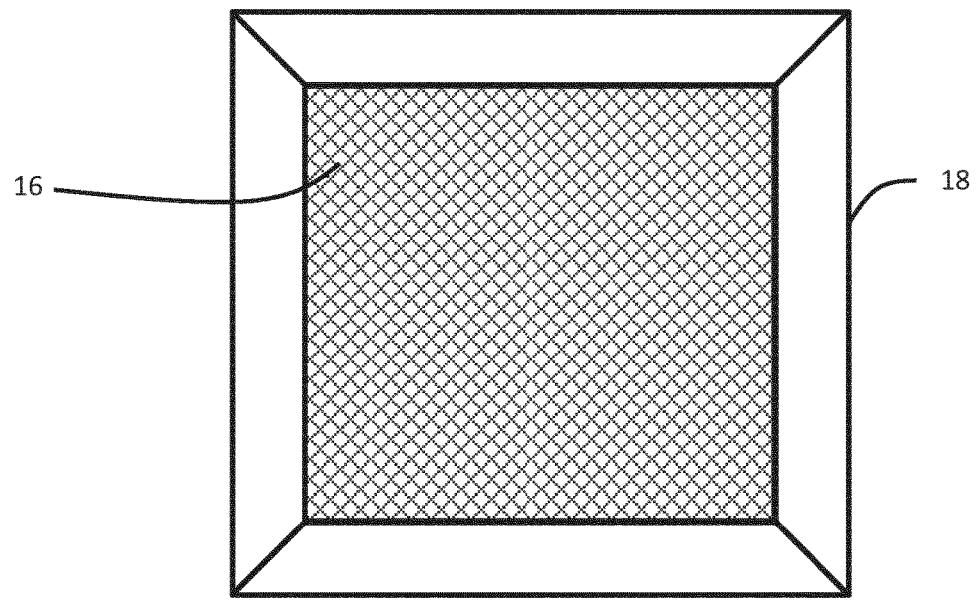
FIG. 2 shows a top-down view of a light emitting arrangement in accordance with the invention.

FIG. 2 shows a top-down view of the example of FIG. 1, showing the full extension of the two optical elements—the opaque optical body 18 and the beam shaping arrangement 16—across the top surface of the arrangement.

The optical properties of the beam-shaping arrangement 16 may be chosen so as provide a greater or lesser degree of collimation, in correspondence with a particular desired beam profile. In a preferred embodiment, it is the beam shaping arrangement which substantially determines the beam profile of the ultimately outputted light, with the secondary collimating funnel 18 capturing only a small fraction of the total light emitted through the beam shaping arrangement.

According to one embodiment, the beam shaping arrangement 16 consists of a Fresnel plate or Fresnel foil. Fresnel foils are characterised by the optical property of collimation or partial collimation, based upon the principles of Fresnel lenses. The plate may for example comprise a symmetric or asymmetric array of prismatic grooves or prismatic/pyramid structures facing toward or away from the source. The prismatic or pyramid elements may vary in their shape or in other optical properties across the surface of the plate, so as to refract incident light by differing degrees at different points across the plate. The overall distribution in shapes or other optical properties may be chosen so as to generate the particular degree of collimation which is required.

Fresnel lenses carry significant advantages over conventional lenses in that a large aperture and short focal length are achievable with significantly reduced mass and thickness. Fresnel structures may be made significantly thinner in comparison with conventional lens counterparts, and in the case of Fresnel foils or plates, take the form of a planar sheet. The short focal length renders them particularly suitable for miniaturised lighting applications, and the minimised thickness allows for reduced overall height of lighting packages.

Fresnel structures are also capable of capturing light of more oblique angle than conventional lenses, allowing for a more efficient collimating action: oblique rays exiting the light source 12 which might otherwise fall outside of the acceptance angle of a conventional lens are nonetheless captured and collimated by the Fresnel foil. This allows for greater overall efficiency of the lighting package, since less light must be sacrificed by the secondary collimating funnel 18.

According to one example, the beam-shaping arrangement comprises an enhanced or adapted Fresnel foil, characterised by comprising one or more optical sheets having a set of parallel pyramidal ridges arranged linearly, rather than circularly. In particular, this arrangement may comprise two microstructured sheets, each sheet comprising a structured layer, the structured layers having an array of elongate locally parallel ridges facing away from the light source, and having an apex angle at the peak of each ridge, wherein the ridges of one sheet are crossed with the ridges of the other sheet such that the local crossing angle is between 30 and 150 degrees. The crossed ridges reflect light incident at certain angles and refract and transmit light incident at other angles. This variation carries the particular advantage that light falling incident upon the structure, within a certain critical angle cone, is reflected back toward the phosphor or light source, while light outside of this angle cone is refracted and transmitted. Back-reflected light is scattered in the phosphor (where one is provided) and subsequently has a second chance of escaping through the Fresnel foil.

This property of light recycling allows for the beam shaping arrangement to be positioned closer to the phosphor and/or light source without loss of intensity, since rays falling outside of the critical acceptance angle for refraction and transmission are not sacrificed but re-directed through reflection. The reflected light still exits the unit after redirection, some bouncing within the package such that almost all rays generated by the light source ultimately exit the package within the desired collimation angle range.

There are at least two examples for the optical character of the collimating funnel 18.

According to a first example, the collimating funnel 18 is a black body with a non-reflective surface. Using a non-reflective (i.e. completely absorbing) body carries the advantage that virtually no secondary reflected rays are generated, and as a result the height of the collimator may be significantly reduced. This is in contrast to, for example, total internal reflection based collimators, wherein secondary rays are generated and must subsequently reflect several times from the surfaces of the collimator in order to acquire propagation angle that is within the desired limits.

Although an absorbing surface means that light falling outside of the desired angular limits is sacrificed, rather than reflected and re-directed, use of a Fresnel foil ensures that only ever a small fraction of the total light generated by the light source is lost in this way. Hence the dimensional advantage of an absorbing secondary collimating body may be achieved without significant loss in output efficiency.

A black, non-reflective surface surrounding each light source also acts to enhance the contrast of the emitted beam. Any light which does get back-reflected toward the light source 12, either by the funnel surface(s), the optical beam shaper 16, or any other surfaces optically downstream, is absorbed and captured, rather than being reflected back by the usual reflective surroundings of the solid state light source. In this way, the luminance of the light source package is more concentrated on the light source itself and any stray light from its surroundings is negligible.

Additionally, contrast may also be improved by extending the material of a black non-reflective optical body so as to block and absorb any potential leakage through the reflecting structure material directly around the light source. The reflective structure itself may typically constitute a volume scatterer material. Such a material is highly reflective, depending upon the thickness, but may nonetheless still transmit some portion of incident light. Covering the material, by simply placing an opaque structure or layer on top, assists in blocking this potential leakage.

According to a second example, the collimating funnel 18 is a body with a reflective surface. In this case, light with too large an escape angle is not absorbed and sacrificed, but rather is reflected. The light may for example be redirected back toward the beam-shaping optic 16 or may be further reflected from the surface(s) of the collimating funnel. A reflecting surface ensures that light is not lost and so efficiency is maximised. However, contrast is to some extent compromised, since a small proportion of rays may escape the distal end of the funnel via reflection from the funnel surface, these not having propagation direction which is within the limits defined by the funnel shape. As a result, the generated beam edge may exhibit greater fuzziness. However, as with the black body, use of a Fresnel optic may significantly limit the degree of this effect, since the majority of rays are already compliant with the desired angular limits.

According to a particular embodiment, the solid state light source is a semiconductor light emitting diode (LED).

In other examples, however, other types of solid-state light sources are utilised, for example organic light emitting diodes (OLEDs), polymer light-emitting diodes (PLEDs) or laser light sources. Solid-state light sources, as opposed to for example incandescent or fluorescent lighting sources, are particularly applicable to the invention by virtue of their small mass and dimensions, as well their low heat-generation and reduced parasitic energy dissipation.

According to another embodiment, the LED utilised by the invention is in particular a patterned sapphire substrate (PSS) chip scale package (CSP) LED. Patterned sapphire substrate LEDs carry the advantage of increased brightness compared with LEDs of more conventional substrate composition. The patterning on the surface of the sapphire substrate reduces the amount of light that is reflected back into the LED upon reaching the substrate boundary, and hence improves the overall brightness of the element.

In a preferred example, a blue PSS CSP LED is used. In this case, white light emission may be achieved through 'converting' the blue light generated to an (approximate) white light spectrum using photoluminescence.

The example of FIG. 1 shows a dedicated phosphor layer 20 situated between the light source 12 and the beam shaping arrangement 16, which functions so as to modify the spectrum of light outputted by the arrangement. It is to be understood that an arrangement having such a phosphor layer is a limiting example of the invention, not the invention in its broadest sense. In the simplest embodiment, a solid-state light source is chosen which emits light already of a desired spectrum, and hence a luminescent phosphor is not required.

In the case that the light source is a blue PSS CSP as described above, a phosphor layer 20 may for example be used consisting of YAG ($Y_3Al_5O_{12}$), wherein this may or may not be Cerium(III)-doped YAG ($Y_3Al_5O_{12}:Ce^{3+}$). Such a layer acts to absorb the light from the blue LED and emit in a broad range from green to red, with the majority of output in yellow. The resultant emission approximates white light output.

Other examples of phosphors for blue LEDs include some photoluminescent rare-earth soped Sialon ceramics, such as Europium(II)-doped β-SiAION, which absorbs ultraviolet and visible light and emits intense broadband visible emission. For white emission, a blue LED may be used with a green and yellow SiAION phosphor.

In the particular examples depicted in FIG. 1, as well as in FIGS. 4-8, there is provided a phosphor layer 20 which is 'undersized' in comparison with the light source 12 beneath it. In this case, the reflecting structure 18 extends inwards, beyond the boundary of the side facing surfaces of the light source, partially covering the top-facing surface(s), in order to further cover the side-facing surfaces of the phosphor.

Figure 3:
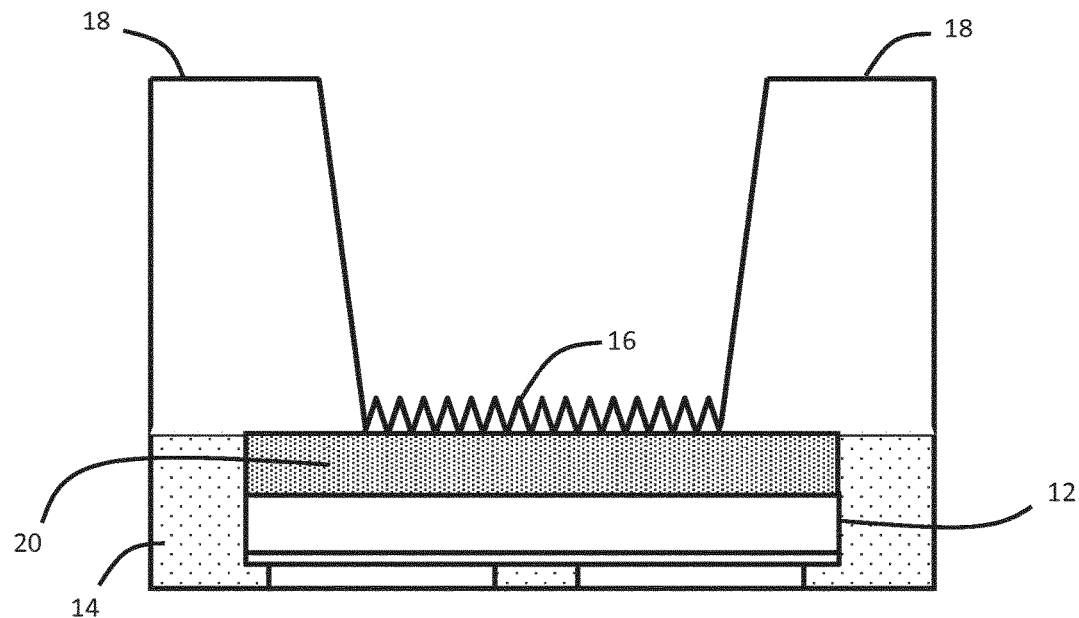
FIG. 3 shows a second example of a light emitting arrangement in accordance with the invention.

However, the phosphor layer may in general not be undersized in this way, and may extend to cover the entire top-surface of the light source. FIG. 3 shows one example of such an arrangement. Here it can be seen that the reflecting structure 14 need not extend beyond the boundary of the side facing surfaces of the light source in order to cover the side surfaces of the phosphor, since the side facing surfaces of the phosphor are in alignment with those of the light source. Additionally, in the particular example of FIG. 3, the secondary collimating funnel has been widened at its base, relative to the width of the light source beneath. In this way, the overall size of the aperture is reduced, thereby providing an emission area comparable with that achieved by use of an undersized phosphor. A smaller emission area results in greater apparent brightness of the light source.

Furthermore, the bottom surface of the overlaid funnel structure may be rendered reflective, thereby allowing for recycling of incident photons back into the phosphor or the light source beneath.

Additionally in the example of FIG. 3, the beam shaping arrangement 16 has a lateral extension which stretches only between the inner boundaries of the opaque body 18. Indeed this variation may additionally be applied to any of the examples previously or subsequently described. Advantages of this arrangement include the capacity to further 'sink' the opaque funnel 18 into layers 14 and 20 (not shown in FIG. 3), thereby 'locking in' the structure to the arrangement beneath, and additionally assisting to block the escape of any light rays from the sides of layers 14 and/or 16 and/or 20.

In addition to altering the optical properties of the beam-shaping arrangement 16, the profile of the emitted beam may also be varied by inclusion of a layer of low refractive index medium between the top surface of the light source 12 and the incident surface of the beam shaping arrangement.

Figure 4:
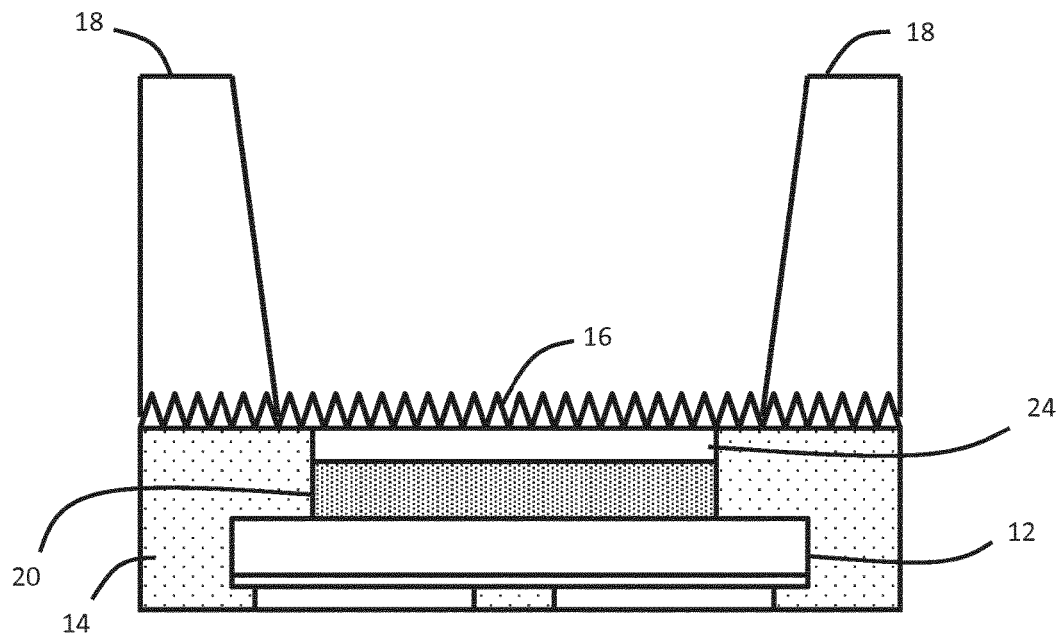
FIG. 4 shows a third example of a light emitting arrangement, having an air gap between the light source and beam-shaping arrangement.

Accordingly, in one embodiment, an example of which is shown in FIG. 4, there is provided between the light source 12 and the beam-shaping plate (or between the phosphor layer 20 and the beam shaping plate) an air-gap 24 across which emitted light must travel. For a package including such an air gap, the beam generated has a comparatively narrower profile than that generated by a package not including an air gap. Or equivalently, for generation of the same collimation effect, an arrangement without an air gap requires optical elements (i.e. beam shaping optic and opaque optical body) of larger dimensions than does an arrangement with an air gap.

The inclusion of an air gap limits dimensions of the optical components, since the refractive effect of light passing from the air of the gap to the denser material of the beam shaping optic bends light rays inward toward the normal. This refraction acts as an effective additional collimation effect, narrowing the range of propagation angles of rays, and hence allowing for a smaller collimating funnel and/or beam-shaping layer.

In a typical example, the air gap may have a vertical extension of just a few microns. Indeed, ideally the air gap is as small as possible: the desirable refractive effect is not dependant on the distance of travel taken by beams across the air layer, and so a minimal air layer allows for correspondingly minimal overall dimensions of the lighting package.

Figure 8A:
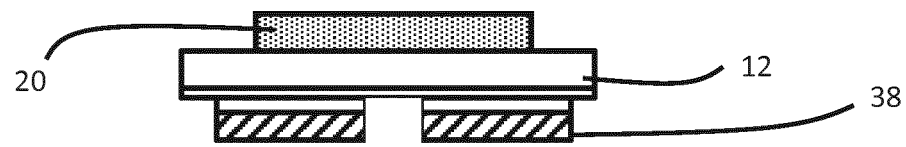
FIGS. 8a-8c show examples of singular die elements (SDEs) in accordance with the invention.

In an ideal embodiment, the footprint of the overall package would not exceed that of the light source itself. Where the light source is an LED, this would mean a lighting arrangement package with footprint no greater than that of the singular die element (SDE) itself, where by singular die element is meant a single LED package, with or without a phosphor. An example of an SDE is shown in FIG. 8*a*.

To realise this, the reflecting structure 14 is required not to extend laterally beyond the maximal lateral extensions of the light source 12. However, such a limitation would undermine one of the functions of the reflecting structure within the invention: that of providing a reflective side-coating to the light source, thereby rendering it top-emitting only. This difficulty may be overcome however, by supplementing the reflecting structure with an additional side-coating for the light source; one which adds only minimally to the lateral dimensions of the overall package.

Figure 5:
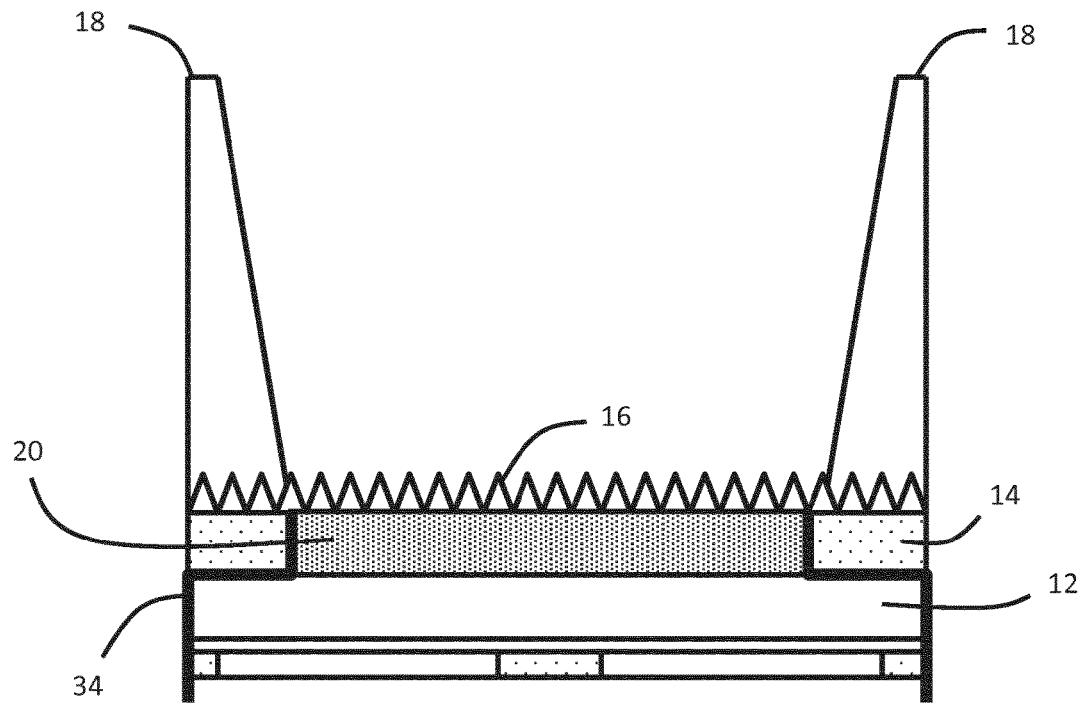
FIG. 5 shows a fourth example of a light emitting arrangement in accordance with the invention, having thin film side-coating.

Accordingly, there is shown in FIG. 5 an embodiment of the invention in which is provided, for covering the side facing surfaces of the light source 12—and the phosphor layer 20, should one be provided—a reflective thin-film side coating 34. The thin film side coating may be applied to the light source and phosphor layer through a physical vapour deposition (PVD process, such as, for example, sputtering deposition. The material of the layer may comprise an alloy or otherwise of one or more reflective metals, such as for example silver or aluminium.

The reflecting structure 14 may consequently be limited in its lateral dimensions so as not to extend beyond the edge of the top-facing surface of the light source 12, since the thin film coating 34 satisfies the role of reflecting side-directed rays back in toward the light source 12. The structure, even with these reduced dimensions, remains able to fulfil its other function within the invention: that of providing structural support for the opaque optical body 18 positioned over the top of it, as well as the beam shaping arrangement 16. In this way, the overall package may have true chip-scale dimensions.

An undersized phosphor 20, as provided in the example of FIG. 5, leaves a perimeter surface surrounding it upon which the reflecting structure 14 can rest and find support, the reflecting structure in turn providing support for the opaque optical body above. In an alternative example, however, a normal sized phosphor might be used, as in the example of FIG. 3, which extends across the entire top surface of the light source, and the thin film coating applied to the sides of these layers. In this case, the reflecting structure 14 might be eliminated altogether, the opaque optical body being entirely structurally supported by the phosphor layer 20.

Figure 6:
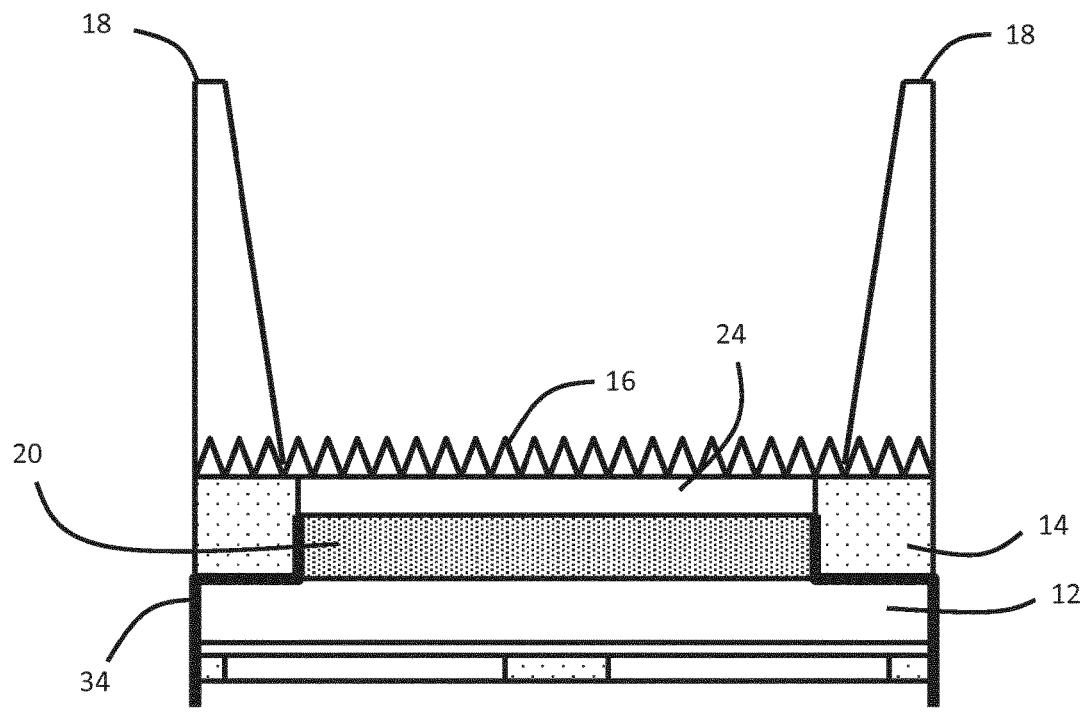
FIG. 6 shows a fifth example of a light emitting arrangement in accordance with the invention, having thin film side-coating and air gap.

The thin-film may be provided for any of the embodiments discussed above, in order to render them of chip-scale dimensions. In FIG. 6, for example, is shown an example of an arrangement with an air gap, similar to that depicted in FIG. 4, with reduced reflective structure and applied thin-film side-coating.

In many applications, a plurality of light emitting arrangements is required and are combined to form a broader lighting unit. In LED automotive lighting, for example, more than one LED package is utilised within each headlight unit, in order to generate the required overall luminosity.

Further, differently shaped configurations of light emitting arrangements in accordance with the invention may be used to generate different resultant beam profiles. For example, a circular configuration of lighting packages might be used to generate a circular beam profile.

The chip-scale dimensions of the lighting arrangement allow for methods of production with process flow at the substrate level; a plurality of lighting arrangements in accordance with the invention may be produced simultaneously using methods building from the substrate level up.

Figure 7A:
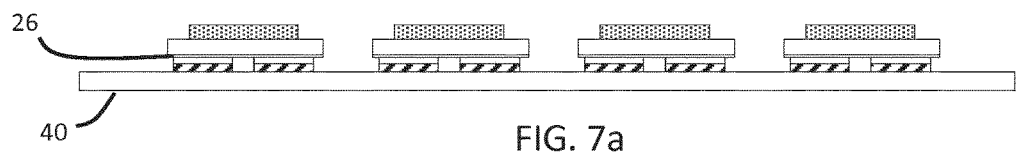
FIGS. 7a-7e show the process flow for a method in accordance with an example of the invention for producing a plurality of light emitting elements.

Accordingly, there are shown in FIGS. 7a-e steps in the process flow for an example of a method of producing a plurality of light emitting elements in accordance with the invention. As shown in FIG. 7a, light source units 26 are first rearranged on a product carrier 40 with the required pitch. A single example of the light source units of FIG. 7a is shown in more detail in FIG. 8a. The unit consists of a solid state light source 12 mounted atop two interconnects 38 for making connection with the product carrier board 40.

In the example depicted in FIG. 8a and FIGS. 7a-e, the light source unit further comprises an undersized phosphor layer 20. As with the examples of FIGS. 1-6, the phosphor layer is not to be considered an essential element of this aspect of the invention. In the case, for example, that the solid state light source is a blue LED, a light source unit with a phosphor may be desired in order to generate white emission. However, in an alternative example, a light source is used which has intrinsic white emission, and hence a phosphor layer is not required.

Figure 7B:
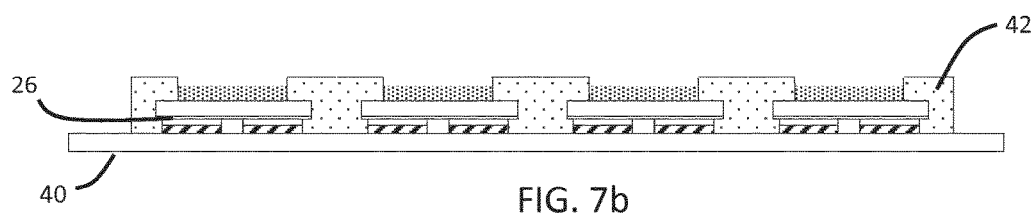

Following distribution of the light source units 26, the gaps between said light source units are filled with a reflective material 42, as shown in FIG. 7b. The reflective material provides a reflective base structure which covers the lateral side surface or surfaces of the light source unit. The filling process may comprise a dispensing process, for example depositing the reflective material 42 between light source units by use of a syringe or other deposition tool. In another example, the process may comprise a moulding.

The material of the formed reflective base structure may comprise, for example, a silicone composition with reflective titanium oxide.

Figure 7C:
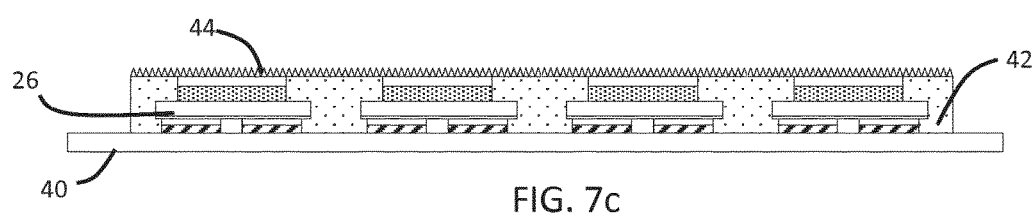

As shown in FIG. 7c, a beam shaping arrangement 44 is then applied over the reflective base structure 42. The beam shaping arrangement may, for example, comprise a Fresnel foil or may alternatively comprise a different optical arrangement for providing a beam-shaping function. In some examples, the beam shaping arrangement 44 may be pre-fabricated in advance and subsequently applied to the reflective base structure 42 through, for example, lamination. In alternative examples however, the beam shaping arrangement may be formed and applied in situ, through for example a printing or spinning process.

In either example, the arrangement 44 might be formed and applied as a single complete structure, or alternatively might be formed and/or applied in stages. In the case that the structure is pre-fabricated, it might be formed in one piece, but subsequently cut and applied in a number of stages. In the case the structure is formed in situ, it might be formed across the entire array of lighting units as one process step, or might be formed through a plurality of sub-steps, for example printing pieces of the arrangement individually atop each lighting package.

In a final example, the beam shaping arrangement 44 might be formed and/or applied as a single continuous structure, but be subject to a subsequent process wherein certain sections are removed through, for example, a mechanical or laser cutting process. In the example embodiment of FIG. 3 for example, the beam shaping arrangement extends only between the inner boundaries of opaque funnel 18. Such an arrangement might be realised through a process of cutting as described above; sections of arrangement 16 coinciding with the footprint of funnel 18 are removed after application. Alternatively, these sections might be eliminated prior to application of arrangement 44, through one of the example processes described in the preceding paragraph.

Figure 7D:
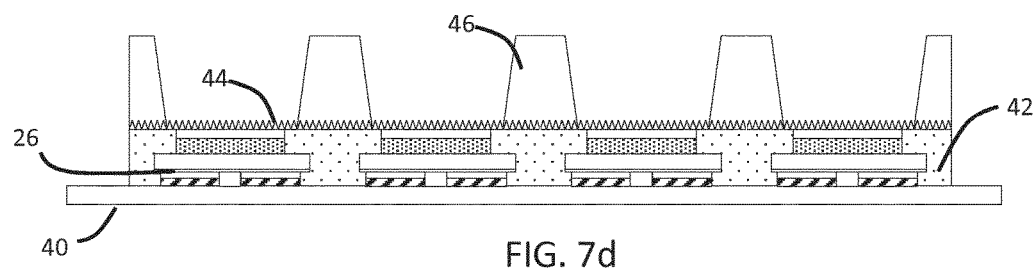

Upon application of the beam shaping arrangement 44, an opaque optical body 46, having a plurality of funnel structures, is subsequently positioned on top of the reflective base structure, as shown in FIG. 7d. Each of the plurality of funnels has a first opening at its base, and the structure is positioned such that each first opening lies over a corresponding solid state light source unit 26. Application of the body 46 may be performed through, for example, an overmoulding procedure, or in an alternative example, the body may be pre-fabricated and subsequently fixed to the reflective base structure in an appropriate position.

In the example depicted in FIG. 7d, the opaque optical body 46 is positioned above the top surface of layer 42. However, in alternative examples, the body might instead be embedded or sunk into layer 42, thereby locking it into place, and additionally allowing the body to perform the function of blocking any light leaking from side-facing surfaces of phosphor layers.

Figure 7E:
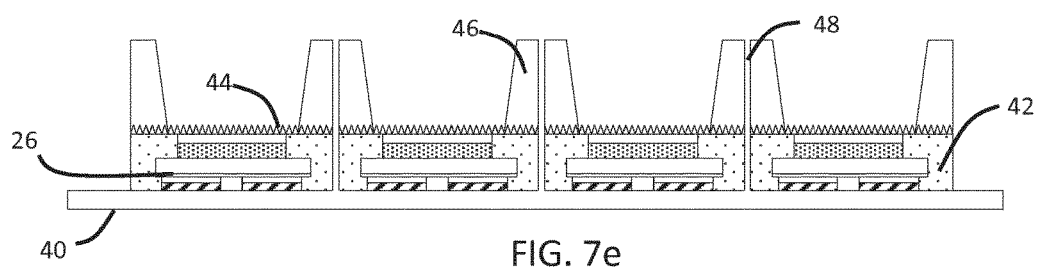

Finally, the structure of FIG. 7d is separated, as shown in FIG. 7e, into individual singular die elements (SDEs) set apart by space 48. An example of an SDE produced by this method is shown in FIG. 8c.

Figure 8B:
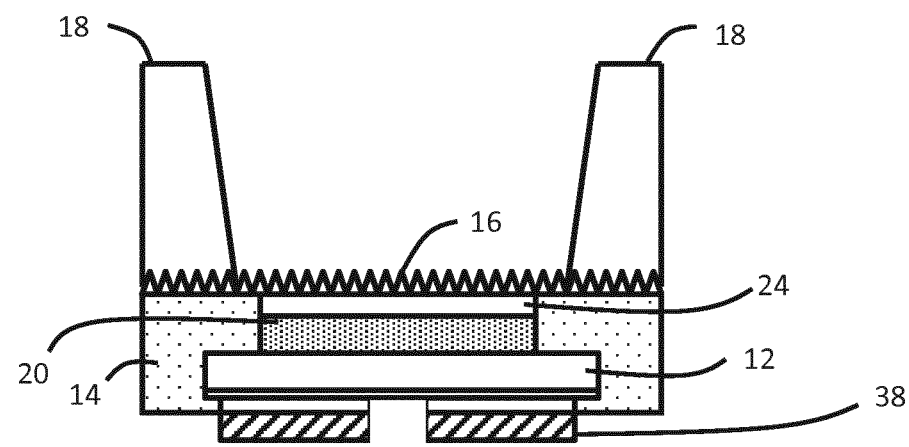
Figure 8C:
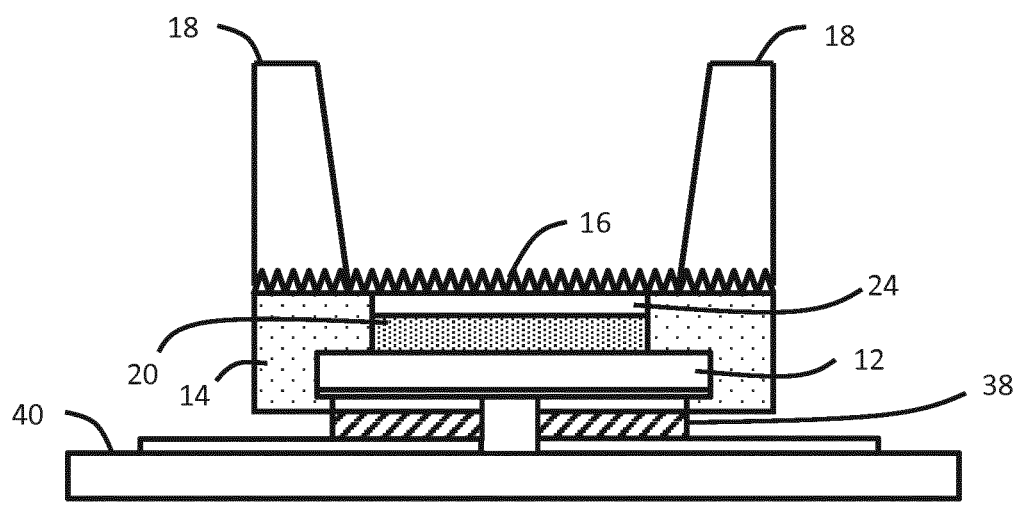

In the example depicted in FIG. 7, the reflective material 42 is provided to a level which is higher than the level of the top surface of the lighting unit 26, such that the singular die elements (SDEs), an example of which is shown in more detail in FIG. 8b, incorporate an air gap 24 immediately beneath the beam-shaping arrangement 16. As with the embodiment of FIG. 4, the inclusion of an air gap varies the profile of the beams generated by the SDE; in particular, an air gap will narrow the beam which is produced.

In the case that an air gap is to be incorporated, this may be achieved, for example, by filling the arrangement of FIG. 7a with the reflective material to the level depicted in FIG. 7b, and subsequently removing portions of the material directly above each of the lighting units. Alternatively, a sacrificial layer might additionally be applied atop the phosphor (or light source) in advance of filling the gaps between lighting units with reflective material 42 (as in FIG. 8b). In this case, the air gap is achieved by simply removing the sacrificial layer once the reflective structure 42 has been provided, where this comprises filling the gaps up to the level of the top surface of the sacrificial layer.

Three other variant examples exist of methods by which SDEs may be produced which include an air gap. In the first example, layered phosphors are used which include an embedded air cavity and a layer stack of YAG ($Y_3Al_5O_{12}$) with an air-filled top layer. In this case, therefore, the phosphor layer 20 effectively extends to fill the entire space occupied by the phosphor layer and the air gap 24 in the example SDE of FIGS. 8b and 8c. However, the phosphor layer itself comprises a further layered structure, the topmost layer of which is air-filled.

In a second example, a sheet material layer with incorporated air inclusions is applied to the top of the light units 26 (with or without phosphor) in advance of filling the gaps with the reflective material 42. The sheet material plays the role of the air gap and may extend to the height otherwise occupied by the latter.

In a third example, a temporary filler material (e.g. resist) is applied to the top of the light source units 26 (with or without phosphor) in advance of providing the opaque optical body 46 to the top of the reflective base structure 42. Following fixture of the optical body, the temporary filler material is removed from the spaces directly above the light source units 26—these spaces being left uncovered by the optical body above. The filler material might be easily removed, for example, through use of a solvent, general application of which would penetrate only the uncovered spaces directly above each light source unit, leaving untouched the filler material structurally supporting the optical body above it.

In another example of a method for producing a plurality of solid state lighting arrangements, with air gap or without air gap, the method of FIGS. 7a-e is supplemented by the additional step of providing a reflecting thin-film coating which covers the one or more lateral side surfaces of the light source units 26. The side coating must be applied to light source units 26 in advance of providing reflective structure 42. For example, the side coating might be applied individually to each light source unit as preliminary step, before subsequently distributing the units atop carrier board 40, as shown in FIG. 7a. The side coating layer may be silver or aluminium for example.

Where a thin film coating is provided, the light source units may be arranged much closer together on the product carrier board 40, since the reflective structure produced by reflective material 42 is not required to provide reflective covering to the lateral side surfaces of lighting units 26, only to provide structural support for the beam shaping arrangement 44 and the opaque optical body 46. In this case, SDEs produced by the separation step of FIG. 7e may have the form of the arrangement depicted in FIG. 5 or 6.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting arrangement, adapted to produce a directional beam of light, comprising:
    a solid state light source unit comprising a solid state light source having a light emitting top surface and one or more lateral side surfaces;
    a reflecting structure that covers at least one of the one or more lateral side surfaces;
    a microstructured beam-shaping arrangement positioned over the solid state light source unit, the microstructured beam-shaping arrangement comprising an array of beam-shaping components; and
    an opaque optical body positioned over the reflecting structure and optically downstream from the microstructured beam-shaping arrangement, to limit angular spread of the directional beam of light, the opaque optical body having a bottom opening to receive light from the solid state light source unit, the opaque optical body having a top opening and a tapered funnel structure surrounding an axis normal to the light emitting top surface of the solid state light source which opens to the top opening which is larger than the bottom opening, the opaque optical body being within maximal lateral extensions of the reflecting structure.

2. The light emitting arrangement of claim 1, wherein the solid state light source unit is a light-emitting diode (LED).

3. The light emitting arrangement of claim 1, wherein the solid state light source unit is a patterned sapphire substrate chip scale package light-emitting diode (LED).

4. The light emitting arrangement of claim 1, wherein the reflecting structure comprises:
    a reflecting thin-film coating covering the at least one of the one or more lateral side surfaces of the solid state light source; and
    a supporting base layer resting along edges of the light emitting top surface of the solid state light source.

5. The light emitting arrangement of claim 4, wherein the supporting base layer is within maximal lateral extensions of the light emitting top surface of the solid state light source.

6. The light emitting arrangement of claim 1, wherein the solid state light source unit further comprises a phosphor layer positioned optically downstream from the solid state light source and optically upstream from the microstructured beam-shaping arrangement, having an area less than an area of the light emitting top surface of the solid state light source.

7. The light emitting arrangement of claim 1 comprising an air gap that is optically downstream from the solid state light source unit and optically upstream from the microstructured beam-shaping arrangement.

8. The light emitting arrangement of claim 1, wherein the opaque optical body is a black body with a non-reflective surface.

9. The light emitting arrangement of claim 1, wherein the microstructured beam-shaping arrangement comprises a Fresnel plate.

10. The light emitting arrangement of claim 1, further comprising at least one additional instance of the light emitting arrangement.

11. A method of producing light emitting elements, comprising:
    providing solid state light source units, each of the solid state light source units comprising a solid state light source having a light emitting top surface and lateral side surfaces;
    providing a product carrier board;
    distributing the solid state light source units on the product carrier board;
    forming a reflective base structure that covers the lateral side surfaces of the solid state light source of each of the solid state light source units, wherein forming the reflective base structure includes filling gaps between the solid state light source units with a supporting base material;
    applying a microstructured beam-shaping arrangement over the solid state light source units, the microstructure beam-shaping arrangement comprising arrays of beam-shaping components, each of the arrays of beam-shaping components being located over a corresponding solid state light source unit of the solid state light source units;
    providing an opaque optical body having funnel structures;
    positioning the opaque optical body on top of the reflective base structure such that each of the funnel structures surrounds an axis normal to the light emitting top surface of the corresponding solid state light source unit of the solid state light source units; and separating at least some of the solid state light source units into singular light emitting elements.

12. The method of claim 11, wherein the solid state light source comprises a patterned sapphire substrate chip scale package light-emitting diode (LED).

13. The method of claim 11, further comprising providing an air gap between each of the arrays of beam-shaping components and the corresponding solid state light source unit of the solid state light source units.

14. The method of claim 11, wherein forming the reflective base structure further comprises, prior to filling the gaps between the solid state light source units with the supporting base material, providing a reflecting thin-film coating that covers the lateral side surfaces of the solid state light source of each of the solid state light source units.

15. The method of claim 14, wherein:
separating at least some of the solid state light source units into the singular light emitting elements comprises separating the reflective base structure into reflective structures; and
each of the reflective structures is within maximal lateral extensions of the light emitting top surface of the solid state light source of the corresponding solid state light source unit of the solid state light source units.

16. The method of claim 11, wherein each of the solid state light source units comprises a phosphor layer optically downstream from the solid state light source of the corresponding solid state light source of the solid state light source units and optically upstream from a corresponding array of beam-shaping components of the arrays of beam-shaping components.

17. The method of claim 16, wherein the phosphor layer has an area less than an area of the light emitting top surface of the solid state light source of the corresponding solid state light source of the solid state light source units.

18. The method of claim 11, wherein the opaque optical body is a black body with a non-reflective surface.

19. The method of claim 11, wherein the microstructured beam-shaping arrangement comprises a Fresnel plate.

20. The light emitting arrangement of claim 1, wherein a maximum angle between a base of a central longitudinal axis of the tapered funnel structure and any point at a top edge of the tapered funnel structure is 40 degrees or less.

21. The light emitting arrangement of claim 1, wherein the opaque optical body is a body with a reflective surface.

22. The method of claim 11, wherein the supporting base material comprises a reflective material.

23. The method of claim 11, wherein a maximum angle between a base of a central longitudinal axis of each of the funnel structures and any point at a top edge of the each of the funnel structures is 40 degrees or less.

24. The method of claim 11, wherein the opaque optical body is a body with a reflective surface.

* * * * *